United States Patent
Actis et al.

(10) Patent No.: US 9,742,445 B1
(45) Date of Patent: Aug. 22, 2017

(54) HIGH POWER RADIO FREQUENCY AMPLIFIER ARCHITECTURE

(71) Applicant: BAE SYSTEMS Information and Electronic Systems Integration Inc., Nashua, NH (US)

(72) Inventors: Robert Actis, Burlington, MA (US); Robert J. Lender, Jr., Pepperell, MA (US); Jared P. Majcher, Manchester, NH (US); John R. Muir, No. Chemlsford, MA (US); Edwin C. Powers, Methuen, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/200,204

(22) Filed: Jul. 1, 2016

(51) Int. Cl.
*H01Q 11/12* (2006.01)
*H04B 1/04* (2006.01)
(Continued)

(52) U.S. Cl.
CPC ............ *H04B 1/04* (2013.01); *H01L 23/02* (2013.01); *H01L 23/3675* (2013.01);
(Continued)

(58) Field of Classification Search
CPC . H01L 23/02; H01L 23/3675; H01L 23/3732; H01L 23/66; H01L 24/32;
(Continued)

(56) References Cited

U.S. PATENT DOCUMENTS 5,856,803 A * 1/1999 Pevler ............... G01S 7/021
324/605
6,697,008 B1 * 2/2004 Sternowski ........ G01S 5/0284
342/14
(Continued)

OTHER PUBLICATIONS

Komiak, "Wideband GaN HEMT Power Amplifiers at K/Ka-Band and E-Band," International Microwave Symposium IMS2016, San Francisco CA, May 22, 2016, 15 pages.
(Continued)

*Primary Examiner* — Nguyen Vo
(74) *Attorney, Agent, or Firm* — Finch & Maloney PLLC; Scott J. Asmus

(57) ABSTRACT

A solid-state amplifier architecture is disclosed. In some embodiments, the disclosed architecture may include first and second channel chipsets configured to amplify either the entire instantaneous frequency band of a radio frequency (RF) input signal or, respectively, sub-bands thereof, which may be divided proportionally between the two chipsets. In some cases, the chipsets may be configured to amplify frequencies in excess of the entire K-band and $K_a$-band frequencies simultaneously. In some cases, the architecture may be configured to address a signal received, for instance, from an electronic warfare (EW) system to a log amplifier stage configured to output a signal to the EW system, in response to which the EW system may generate a RF signal for amplification by the architecture for transmission. To facilitate heat dissipation, the architecture may be coupled, in part or in whole, with a thermally conductive carrier, optionally with an intervening diamond heat spreader layer.

19 Claims, 5 Drawing Sheets

(51) Int. Cl.
*H03F 3/19* (2006.01)
*H01L 25/065* (2006.01)
*H01L 23/66* (2006.01)
*H01L 23/00* (2006.01)
*H03F 3/21* (2006.01)
*H01L 23/367* (2006.01)
*H01L 23/373* (2006.01)
*H01L 23/02* (2006.01)

(52) U.S. Cl.
CPC ...... *H01L 23/3732* (2013.01); *H01L 23/3736* (2013.01); *H01L 23/66* (2013.01); *H01L 24/32* (2013.01); *H01L 25/0655* (2013.01); *H03F 3/19* (2013.01); *H03F 3/211* (2013.01); *H01L 2223/6644* (2013.01); *H01L 2223/6683* (2013.01); *H01L 2224/29111* (2013.01); *H01L 2224/29144* (2013.01); *H01L 2224/32245* (2013.01); *H01L 2224/32502* (2013.01); *H01L 2924/01006* (2013.01); *H01L 2924/0132* (2013.01); *H01L 2924/01042* (2013.01); *H01L 2924/01322* (2013.01); *H01L 2924/1033* (2013.01); *H01L 2924/1423* (2013.01); *H01L 2924/1426* (2013.01); *H01L 2924/15747* (2013.01); *H03F 2200/111* (2013.01); *H03F 2200/451* (2013.01); *H03F 2200/552* (2013.01)

(58) Field of Classification Search
CPC ... H01L 25/0655; H01L 23/3736; H03F 3/19; H03F 3/211; H04B 2001/0408; H04B 1/0483
See application file for complete search history.

(56) References Cited

U.S. PATENT DOCUMENTS

| | | | |
|---|---|---|---|
| 7,924,097 B2 | 4/2011 | Lender, Jr. et al. | |
| 8,076,975 B1 | 12/2011 | Lender, Jr. et al. | |
| 8,669,812 B2 | 3/2014 | Actis et al. | |
| 8,989,683 B2 | 3/2015 | Actis et al. | |
| 2007/0139247 A1* | 6/2007 | Brown | F41H 13/0043 342/13 |
| 2013/0260703 A1* | 10/2013 | Actis | H03G 3/3042 455/127.2 |
| 2015/0171015 A1* | 6/2015 | Mahajan | H01L 23/5381 257/712 |

OTHER PUBLICATIONS

Campbell et al., "Design and Performance of 16-40GHz GaN Distributed Power Amplifier MMICs Utilizing an Advanced 0.15µm GaN Process," Qorvo, Infrastructure and Defense Products Division, International Microwave Symposium IMS2016, San Francisco CA, May 22, 2016, 4 pages.

* cited by examiner

HIGH POWER RADIO FREQUENCY AMPLIFIER ARCHITECTURE

FIELD OF THE DISCLOSURE

The present disclosure relates to solid-state amplifiers and more particularly to high power radio frequency (RF) amplifiers.

BACKGROUND

Electronic power amplifiers are typically designed to convert signals from a lower to a higher power level for output. Radio frequency (RF) power amplifiers are generally designed to operate on signals having frequencies in the range of 30 kHz to 100 GHz, which is commonly known as the RF band of the electromagnetic spectrum. Some RF power amplifiers are specifically designed to operate on signals in the frequency range of 1-30 GHz, which is known as the microwave sub-band of the RF band. Amplifiers designed to operate in the RF sub-band frequency range of 30-100 GHz are generally known as millimeter-wave amplifiers.

SUMMARY

One example embodiment provides a solid-state amplifier including: a first input configured to receive a first radio frequency (RF) signal from a first source external to the amplifier; a second input configured to receive a second RF signal from a second source external to the amplifier; a first chipset configured to amplify a first sub-band of the second RF signal; a second chipset configured to amplify a second sub-band of the second RF signal; and a carrier coupled with at least one of the first chipset and the second chipset, wherein the carrier includes a thermally conductive material. In some cases, the solid-state amplifier further includes at least one successive detection logarithmic video amplifier (SDLVA) configured to receive the first RF signal and output a signal indicative of an amplitude level of the first RF signal received by the first input. In some such instances, the second input is configured to receive the second RF signal in response to receipt of the signal indicative of the amplitude level by the second source external to the amplifier. In some cases, the carrier constitutes a monolithic component. In some other cases, the carrier constitutes a multi-piece component including at least: a first portion; and a second portion to which both the first chipset and the second chipset are coupled. In some instances, the carrier includes a copper-molybdenum (Cu—Mo) alloy. In some cases, the carrier is coupled with the at least one of the first chipset and the second chipset via at least one eutectic bonding layer. In some cases, the solid-state amplifier further includes a diamond layer disposed between the carrier and at least one semiconductor die of at least one of the first chipset and the second chipset, wherein: the carrier is coupled with the diamond layer via a first eutectic bonding layer; and the at least one semiconductor die is coupled with the diamond layer via a second eutectic bonding layer. In some instances, the first chipset includes: a pre-driver; and a driver operatively coupled with an output of the pre-driver; and at least one of the pre-driver and the driver is configured as a gallium nitride (GaN)-based monolithic microwave integrated circuit (MMIC). In some instances, the second chipset includes: a pre-driver; and a high power amplifier operatively coupled with an output of the pre-driver; and at least one of the pre-driver and the high power amplifier is configured as a gallium nitride (GaN)-based monolithic microwave integrated circuit (MMIC). In some cases, the solid-state amplifier further includes a divider configured to split the second RF signal for delivery to the first chipset and the second chipset. In some such instances, the solid-state amplifier further includes a pre-driver configured to deliver the second RF signal to the divider. In some cases, at least one of the first source and the second source includes an electronic warfare (EW) system.

Another example embodiment provides a power amplifier device including: a first chipset configured to amplify a first sub-band of a radio frequency (RF) input signal, the first chipset including: a first pre-driver; and a first driver operatively coupled with an output of the first pre-driver; a second chipset configured to amplify a second sub-band of the RF input signal, the second chipset including: a second pre-driver; and a high power amplifier operatively coupled with an output of the second driver; and a carrier, wherein at least one of the first pre-driver, the first driver, the second pre-driver, and the high power amplifier is coupled with the carrier via at least one eutectic bonding layer. In some cases, the carrier includes a copper-molybdenum (Cu—Mo) alloy and is configured as a monolithic component. In some instances, the carrier at least partially includes a copper-molybdenum (Cu—Mo) alloy and is configured as a multi-piece component including at least: a first portion; and a second portion to which the first pre-driver, the first driver, the second pre-driver, and the high power amplifier are coupled. In some cases, the power amplifier device further includes a diamond layer disposed between the carrier and at least one of the first pre-driver, the first driver, the second pre-driver, and the high power amplifier, wherein: the diamond layer is coupled with the carrier via a first eutectic bonding layer of the at least one eutectic bonding layer; and the at least one of the first pre-driver, the first driver, the second pre-driver, and the high power amplifier is coupled with the diamond layer via a second eutectic bonding layer of the at least one eutectic bonding layer.

Another example embodiment provides a radio frequency (RF) transmitter including: a power amplifier architecture configured to receive a radio frequency (RF) input signal and including: a first chipset configured to amplify at least one of a first sub-range and a full range of a K-band through $K_a$-band instantaneous frequency range of the RF input signal, wherein the resultant amplified signal is of a first power level; and a second chipset configured to amplify at least one of a second sub-range and the full range of the K-band through $K_a$-band instantaneous frequency range of the RF input signal, wherein the resultant amplified signal is of a second power level that differs from the first power level; a thermally conductive carrier to which the first chipset and the second chipset are coupled; and a housing configured to house the power amplifier architecture and the thermally conductive carrier, wherein the thermally conductive carrier is configured to be physically coupled with the housing. In some cases, at least one of the first chipset and the second chipset is coupled with the thermally conductive carrier via at least one eutectic bonding layer. In some instances, the RF transmitter further includes a diamond heat spreader disposed between at least a portion of the second chipset and the thermally conductive carrier, wherein: the diamond heat spreader is coupled with the thermally conductive carrier via a first eutectic bonding layer; and the at least a portion of the second chipset is coupled with the diamond heat spreader via a second eutectic bonding layer.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

Figure 1:
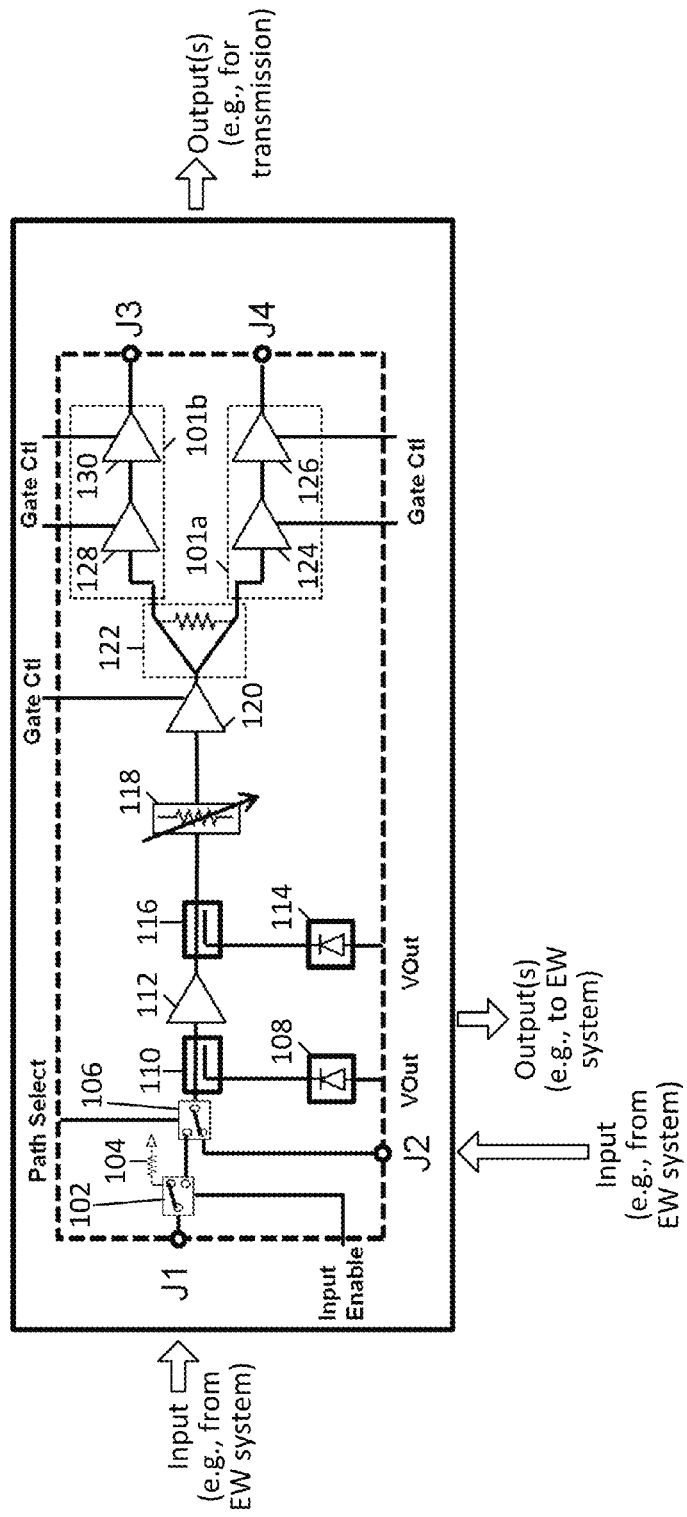
FIG. 1 illustrates a block diagram of an amplifier circuit architecture configured in accordance with an embodiment of the present disclosure.

These and other features of the present embodiments will be understood better by reading the following detailed description, taken together with the figures described herein. The accompanying drawings are not intended to be drawn to scale. In the drawings, each identical or nearly identical component that is illustrated in various figures may be represented by a like numeral. For purposes of clarity, not every component may be labeled in every drawing.

DETAILED DESCRIPTION

A solid-state amplifier architecture is disclosed. In accordance with some embodiments, the disclosed architecture may include first and second channel chipsets configured to amplify either the entire instantaneous frequency band of a radio frequency (RF) input signal or, respectively, sub-bands thereof, which may be divided proportionally between the two chipsets. In some cases, the first and second chipsets may be configured to amplify frequencies in excess of the entire K-band and $K_a$-band frequencies simultaneously. To these ends, a given chipset may include one or more gallium nitride (GaN)-based monolithic microwave integrated circuit (MMIC) dies, in accordance with some embodiments. In some cases, the disclosed architecture may be configured to address a signal received, for instance, from an electronic warfare (EW) system to a log amplifier stage configured to output a signal to the EW system, in response to which the EW system may generate a RF signal for amplification by the architecture for transmission. To facilitate heat dissipation, the architecture may be coupled, in part or in whole, with a thermally conductive carrier, optionally with an intervening diamond heat spreader layer, in accordance with some embodiments. Numerous configurations and variations will be apparent in light of this disclosure.

General Overview

Of the various III-V semiconductor materials, gallium nitride (GaN) has particularly high power density characteristics that make it suitable for use, for example, in solid-state radio frequency (RF) power amplifiers that may be employed in transmitters utilized in advanced electronic warfare (EW) systems. However, such GaN-based devices generally have high power dissipation, and thermal management in the package design of these devices can be difficult. The continued demand for next-generation transmitters that provide sufficiently high levels of RF power over increasingly wider frequency bandwidths using architectures that exploit reduced size, weight, and power (SWaP), all within small form factor packages, will tend to exacerbate these non-trivial issues.

Thus, and in accordance with some embodiments of the present disclosure, a solid-state amplifier architecture is disclosed. In accordance with some embodiments, the disclosed architecture may include first and second channel chipsets configured to amplify either the entire instantaneous frequency band of an RF input signal or, respectively, sub-bands thereof, which may be divided proportionally between the two chipsets. In some cases, the first and second chipsets may be configured to amplify frequencies in excess of the entire K-band to $K_a$-band instantaneous frequency bandwidth, or sub-bands of the entire instantaneous frequency bandwidth, proportionally divided among the chipsets. To these ends, a given chipset may include one or more gallium nitride (GaN)-based monolithic microwave integrated circuit (MMIC) dies, in accordance with some embodiments. In some cases, the disclosed architecture may be configured to address a signal received, for instance, from an electronic warfare (EW) system to a log amplifier stage configured to output a signal to the EW system, in response to which the EW system may generate a RF signal for amplification by the architecture for transmission. To facilitate heat dissipation, the architecture may be coupled, in part or in whole, with a thermally conductive carrier, optionally with an intervening diamond heat spreader layer, in accordance with some embodiments.

In accordance with some embodiments, the disclosed amplifier architecture may be configured for use in providing a solid-state power amplifier device configured to operate at millimeter-wave frequencies in a manner which provides high power density amplification over several full bands (e.g., K-band and $K_a$-band) of instantaneous frequency. In accordance with some embodiments, such an amplifier device may be configured to deliver in the range of about 5-30 W (or greater) of RF power over the entire instantaneous frequency bandwidth encompassing in excess of K-band through $K_a$-band frequency ranges, in some instances with continuous wave (CW) performance. In accordance with some embodiments, the disclosed architecture may include a detector log amplifier configured to provide a receive-input capability by which a signal indicative of a detected threat or other stimulus of interest may be provided for rapid processing, and in response to which an associated transmit signal can be initiated via the transmit input of the architecture.

As discussed herein, power consumption and thermal management within the context of the disclosed architecture may be provided in any of a wide variety of ways. For example, in some embodiments, the disclosed architecture may include MIMIC dies that are spatially distributed in a manner that spreads out the heat generated by the individual transistor devices. In some embodiments, the disclosed architecture may be coupled, in part or in whole, with a thermally conductive carrier configured to distribute heat generated by the devices coupled thereto. In some embodiments, a diamond heat spreader optionally may be disposed under a given MMIC die, providing heat extraction and contributing to spreading of the thermal load. In some embodiments, the disclosed architecture may be configured to allow for direct control over which constituent semiconductor die(s) of a given channel chipset are enabled/disabled at a given time. Such individualized on/off control of all (or some sub-set) of the constituent MIMIC dies may provide for fine control over the gain and power levels of the output signal(s), in accordance with some embodiments. As will be appreciated in light of this disclosure, the ability to quickly and efficiently toggle operation of the solid-state architecture via one or more gate control signals, for instance, may reduce the amount of excess on-time of all (or some sub-set) of the constituent MMIC dies and thus may realize reductions in DC power consumption and, consequently, the amount of heat generated by the architecture. In accordance with some embodiments, the improved heat extraction performance and management of the total thermal load may serve to minimize (or otherwise reduce) the thermal rise at the junctions of the GaN-based transistor devices, and thus may realize improvements in device performance (e.g., more efficient generation of high-power RF signals) and reliability, at least in some instances.

In accordance with some embodiments, the disclosed architecture may include MIMIC dies coupled to a thermally conductive carrier which have undergone one or more coefficient of thermal expansion (CTE)-compliant die attachment processes and thus can withstand temperature cycling stresses without delamination. Thus, at least in some instances, the MIMIC dies of the disclosed architecture need not be physically fastened to their host carrier or host module via screws or the like, though such fasteners optionally may be employed, if desired. In accordance with some embodiments, a reduction in the quantity (or outright omission) of such fasteners may realize a reduction in the areal footprint of the carrier, thereby contributing to a reduction in overall package size while still accommodating the thermal management needs of the semiconductor dies coupled therewith.

In accordance with some embodiments, the disclosed architecture may be utilized in providing a power amplifier which exhibits both high RF power and wide instantaneous frequency bandwidth performance in a compact, small form factor transmitter package that does not require extensive tuning or a high degree of touch labor during module assembly. In some instances, the resultant reduced-SWaP transmitter may be suitable for application, for example, in an electronic warfare (EW) system. It should be noted, however, that an amplifier device configured as variously described herein need not be limited only to transmission capabilities, as in accordance with some embodiments, both transmit and receive (e.g., transceiver) capabilities may be provisioned.

Architecture and Operation

FIG. 1 illustrates a block diagram of an amplifier circuit architecture 100 configured in accordance with an embodiment of the present disclosure. As can be seen, architecture 100 includes two input terminals (J1 and J2) and two output terminals (J3 and J4). In accordance with some embodiments, input terminal J2 may be configured to receive a first signal, for example, from an electronic warfare (EW) system external to architecture 100. In some cases, the first signal received at input terminal J2 may be one which was output by the EW system, for instance, in response to a detected threat (e.g., as sensed by a sensor of the EW system). In turn, either or both of amplifiers 108 and 114 (discussed below) may output to the EW system a signal ($V_{Out}$), for instance, indicative of the amplitude level of the first signal received at input terminal J2. In response, the EW system may output a second signal that may be received at input terminal J1 of architecture 100 for amplification thereby. Output terminals J3 and J4 of architecture 100 each may be configured to output one of two output RF power levels, in accordance with some embodiments. As further discussed herein, architecture 100 may be configured to provide gain for a signal propagating from input terminal J1 to output terminal J3, in accordance with some embodiments. In accordance with some embodiments, architecture 100 may be configured for operation in excess of K-band through $K_a$-band instantaneous frequency bandwidth.

As can be seen, architecture 100 includes a switch 102, which may be a single-pole, double-throw (SPDT) switch or any other suitable switch, as will be apparent in light of this disclosure. An input of switch 102 may be operatively coupled with an upstream input terminal J1, in accordance with some embodiments. As previously noted, a signal output by an EW system external to architecture 100 may be received at input terminal J1 for amplification and transmission, in accordance with some embodiments. Another input of switch 102 may be operatively coupled with the output of an upstream source of a signal (Input Enable) external to architecture 100, in accordance with some embodiments. The Input Enable signal may control whether a signal received at input terminal J1 from an external EW system is: (1) delivered to ground through a resistor 104, the particular type and electrical resistance value of which may be customized, as desired for a given target application or end-use; or (2) propagated through architecture 100, in accordance with some embodiments.

Architecture 100 further includes a switch 106, which may be a SPDT switch or any other suitable switch, as will be apparent in light of this disclosure. In some instances, switch 106 and switch 102 may be of the same configuration, whereas in other instances, they may be of different configurations. An input of switch 106 may be operatively coupled with an upstream input terminal J2, in accordance with some embodiments. As previously noted, a signal output by an EW system external to architecture 100 may be received at input terminal J2. In some cases, such a signal may be output by the EW system, for instance, in response to a detected threat (e.g., as sensed by a sensor of the EW system). Another input of switch 106 may be operatively coupled with an output of upstream switch 102, in accordance with some embodiments. Another input of switch 106 may be operatively coupled with an upstream source of a signal (Path Select) external to architecture 100, in accordance with some embodiments. The Path Select signal may control whether a signal received at input terminal J1 and passed through switch 102 is propagated through architecture 100, in accordance with some embodiments.

Architecture 100 also includes an amplifier 108, which may be configured as a successive detection logarithmic video amplifier (SDLVA) or any other suitable standard, custom, or proprietary amplifier, as will be apparent in light of this disclosure. An input of amplifier 108 may be operatively coupled with a coupler 110 (discussed below), in accordance with some embodiments. As previously noted, amplifier 108 may be configured to output a signal ($V_{Out}$), for instance, to an EW system external to architecture 100. The $V_{Out}$ signal of amplifier 108 may be indicative of the amplitude level of the signal received at input terminal J2, in accordance with some embodiments.

Architecture 100 further includes a coupler 110, which may be configured as any suitable standard, custom, or proprietary coupler, as will be apparent in light of this disclosure. An input of coupler 110 may be operatively coupled with an output of upstream switch 106, in accordance with some embodiments. An output of coupler 110 may be operatively coupled with an input of downstream amplifier 108, in accordance with some embodiments.

Architecture 100 further includes an amplifier 112, which may be configured as a low-noise amplifier (LNA) or any other suitable standard, custom, or proprietary amplifier, as will be apparent in light of this disclosure. Amplifier 112 may include, in part or in whole, a gallium nitride (GaN), gallium arsenide (GaAs), or other III-V semiconductor-based transistor device, in accordance with some embodiments. An input of amplifier 112 may be operatively coupled with an output of upstream coupler 110, in accordance with some embodiments.

Architecture 100 also includes an amplifier 114, which may be configured as a SDLVA or any other suitable standard, custom, or proprietary amplifier, as will be apparent in light of this disclosure. In some instances, amplifier 114 and amplifier 108 may be of the same configuration, whereas in other instances, they may be of different configurations. An input of amplifier 114 may be operatively coupled with a coupler 116 (discussed below), In accordance with some embodiments. As previously noted, amplifier 114 may be configured to output a signal ($V_{Out}$), for instance, to an EW system external to architecture 100. The $V_{Out}$ signal of amplifier 114 may be indicative of the amplitude level of the signal received at input terminal J2, in accordance with some embodiments.

Architecture 100 further includes a coupler 116, which may be configured as any suitable standard, custom, or proprietary coupler, as will be apparent in light of this disclosure. In some instances, coupler 116 and coupler 110 may be of the same configuration, whereas in other instances, they may be of different configurations. An input of coupler 116 may be operatively coupled with an output of upstream amplifier 112, in accordance with some embodiments. An output of coupler 116 may be operatively coupled with an input of downstream amplifier 114, in accordance with some embodiments.

Architecture 100 also includes an attenuator 118, which may be configured as a variable voltage attenuator (VVA) or any other suitable standard, custom, or proprietary attenuator, as will be apparent in light of this disclosure. An input of attenuator 118 may be operatively coupled with an output of upstream coupler 116, in accordance with some embodiments.

Architecture 100 further includes a pre-driver 120, which may be of any suitable standard, custom, or proprietary pre-driver configuration, as will be apparent in light of this disclosure. In some instances, pre-driver 120 may be a single-stage pre-driver, whereas in other instances, it may be a multi-stage pre-driver (e.g., two-stage, three-stage, and so forth). An input of pre-driver 120 may be operatively coupled with an output of upstream attenuator 118, in accordance with some embodiments. Another input of pre-driver 120 may be operatively coupled with an upstream source of a signal (Gate Control) external to architecture 100, in accordance with some embodiments. The Gate Control signal may control whether pre-driver 120 is enabled or disabled, in accordance with some embodiments. In some instances, the Gate Control signal may be received from an EW system external to architecture 100.

Architecture 100 also includes a divider 122, which may be of any suitable standard, custom, or proprietary signal splitter configuration, as will be apparent in light of this disclosure. In some embodiments, divider 122 may be a passive power divider, such as, for example, an in-phase Wilkinson power divider, including one or more resistors. In some other embodiments, divider 122 may be an active power divider configured to provide gain in addition to power division of a signal. In some instances, divider 122 may be configured to provide an approximately 50%/50% power split of the signal input thereto, though even power splitting is not necessary to operation of architecture 100. In accordance with some embodiments, divider 122 may be configured as any one, or combination, of the various dividers described in U.S. Pat. No. 8,989,683, issued on Mar. 24, 2015, and titled "Ultra-Wideband High Power Amplifier Architecture," which is incorporated by reference herein in its entirety. An input of divider 122 may be operatively coupled with an output of upstream pre-driver 120, in accordance with some embodiments. In some embodiments, divider 122 may be a two-channel (2:1) splitter configured to split the signal received from upstream amplifier 120 into two signals, one of which is provided to a downstream sub-band channel chipset 101a (discussed below) and the other of which is provided to a downstream sub-band channel chipset 101a (discussed below).

As can be seen further from FIG. 1, architecture 100 also includes: (1) a first sub-band channel chipset 101a; and (2) a second sub-band channel chipset 101b. As explained above, divider 122 may split a received input signal and deliver that split signal to downstream channel chipsets 101a and 101b, in accordance with some embodiments. Each such channel chipset 101a and 101b may be configured to amplify either the full instantaneous frequency band or a narrower frequency sub-band (channel) of the input signal which it receives. For instance, first sub-band channel chipset 101a may be configured, in accordance with some embodiments, to amplify frequencies of the input signal (received from divider 122) in at least a portion of the full instantaneous K-band through $K_a$-band range and output the resultant signal at output terminal J4. Second sub-band channel chipset 101b may be configured, in accordance with some embodiments, to amplify frequencies of the input signal (received from divider 122) in the full instantaneous K-band through $K_a$-band range or a sub-set of the full range and output the resultant signal at output terminal J3. Thus, in a more general sense, channel chipsets 101a and 101b may be configured to partition and amplify the full, instantaneous operating bandwidth of the original input signal (received from divider 122), in accordance with some embodiments. In some cases, the resultant amplified sub-bands may be delivered to downstream output terminals J3 and J4, for example, for transmission by antennas associated with the channel chipsets 101a and 101b.

First sub-band channel chipset 101a includes a pre-driver 124, which may be of any suitable standard, custom, or proprietary electronic pre-driver configuration, as will be apparent in light of this disclosure. In some instances, pre-driver 124 may be a single-stage pre-driver, whereas in other instances, it may be a multi-stage pre-driver (e.g., two-stage, three-stage, and so forth). In accordance with some embodiments, pre-driver 124 may be configured as any one, or combination, of the various pre-drivers described in U.S. Pat. No. 7,924,097, issued on Apr. 12, 2011, and titled "Solid-State Ultra-Wideband Microwave Power Amplifier Employing Modular Non-Uniform Distributed Amplifier Elements," which is incorporated by reference herein in its entirety. An input of pre-driver 124 may be operatively coupled with an output of upstream divider 122, in accordance with some embodiments. Another input of pre-driver 124 may be operatively coupled with an output of an upstream source of a signal (Gate Control) external to architecture 100, in accordance with some embodiments. The Gate Control signal may control whether pre-driver 124 is enabled or disabled, in accordance with some embodiments. In some instances, the Gate Control signal may be received from an EW system external to architecture 100.

Figure 2:
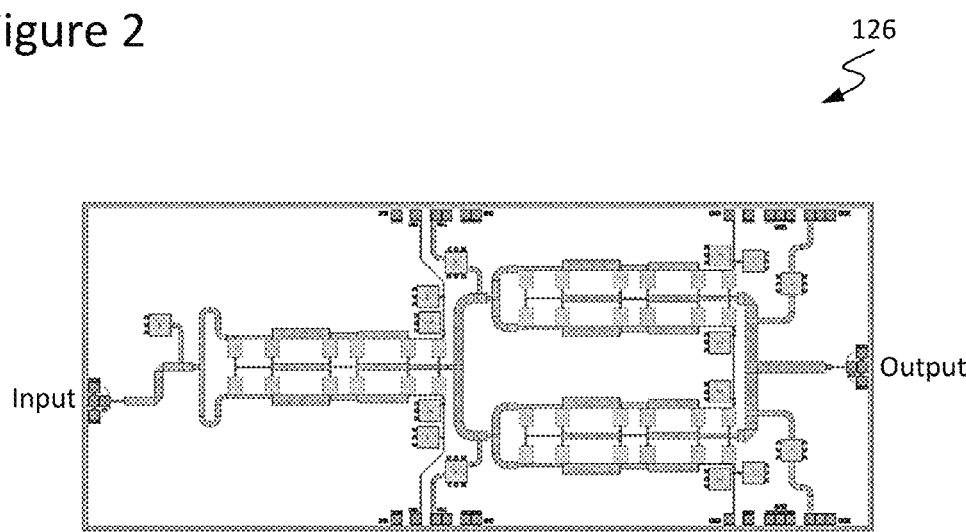
FIG. 2 illustrates a plan view of a die layout of a driver configured in accordance with an embodiment of the present disclosure.

First sub-band channel chipset 101a also includes a driver 126, which may be of any suitable standard, custom, or proprietary electronic driver configuration, as will be apparent in light of this disclosure. In some instances, driver 126 may be a single-stage driver, whereas in other instances, it may be a multi-stage driver (e.g., two-stage, three-stage, and so forth). In accordance with some embodiments, driver 126 may be configured as any one, or combination, of the various drivers described in U.S. Pat. No. 8,989,683, which is incorporated by reference above. In some cases, driver 126 may be configured to amplify signals within the full K-band through $K_a$-band instantaneous frequency range or any sub-range thereof. FIG. 2 illustrates a plan view of a die layout of a driver 126 configured in accordance with an embodiment of the present disclosure. An input of driver 126 may be operatively coupled with an output of upstream amplifier 124, in accordance with some embodiments. Another input of driver 126 may be operatively coupled with an output of an upstream source of a signal (Gate Control) external to architecture 100, in accordance with some embodiments. The Gate Control signal may control whether driver 126 is enabled or disabled, in accordance with some embodiments. In some instances, the Gate Control signal may be received from an EW system external to architecture 100. An output of driver 126 may be operatively coupled with a terminal J4, at which an output signal (e.g., a low-power output signal) of architecture 100 may be provided.

Second sub-band channel chipset 101b includes a pre-driver 128, which may be of any suitable standard, custom, or proprietary electronic pre-driver configuration, as will be apparent in light of this disclosure. In some instances, pre-driver 128 may be a single-stage pre-driver, whereas in other instances, it may be a multi-stage pre-driver (e.g., two-stage, three-stage, and so forth). In some instances, pre-driver 128 and pre-driver 124 may be of the same configuration, whereas in other instances, they may be of different configurations. In accordance with some embodiments, pre-driver 128 may be configured as any one, or combination, of the various pre-drivers described in U.S. Pat. No. 7,924,097, which is incorporated by reference above. An input of pre-driver 128 may be operatively coupled with an output of upstream divider 122, in accordance with some embodiments. Another input of pre-driver 128 may be operatively coupled with an output of an upstream source of a signal (Gate Control) external to architecture 100, in accordance with some embodiments. The Gate Control signal may control whether pre-driver 128 is enabled or disabled, in accordance with some embodiments. In some instances, the Gate Control signal may be received from an EW system external to architecture 100.

Figure 3:
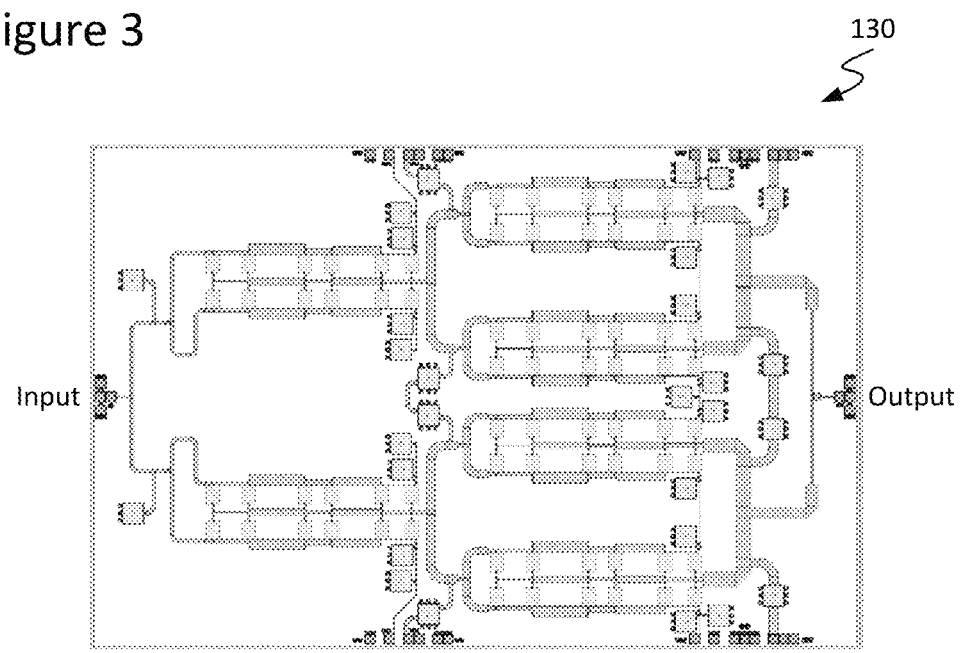
FIG. 3 illustrates a plan view of a die layout of a high-power amplifier (HPA) configured in accordance with an embodiment of the present disclosure.

Second sub-band channel chipset 101b also includes a high-power amplifier (HPA) 130, which may be of any suitable standard, custom, or proprietary electronic amplifier configuration, as will be apparent in light of this disclosure. In some instances, HPA 130 may be a single-stage HPA, whereas in other instances, it may be a multi-stage HPA (e.g., two-stage, three-stage, and so forth). In accordance with some embodiments, HPA 130 may be configured as any one, or combination, of the various high-power amplifiers described in U.S. Pat. No. 8,076,975, issued on Dec. 13, 2011, and titled "Broadband High Power Amplifier," which is incorporated by reference herein in its entirety. In some cases, HPA 130 may be configured to amplify signals within the full K-band through $K_a$-band instantaneous frequency range or any sub-range thereof. FIG. 3 illustrates a plan view of a die layout of a HPA 130 configured in accordance with an embodiment of the present disclosure. An input of HPA 130 may be operatively coupled with an output of upstream pre-driver 128, in accordance with some embodiments. Another input of HPA 130 may be operatively coupled with an output of an upstream source of a signal (Gate Control) external to architecture 100, in accordance with some embodiments. The Gate Control signal may control whether HPA 130 is enabled or disabled, in accordance with some embodiments. In some instances, the Gate Control signal may be received from an EW system external to architecture 100. An output of HPA 130 may be operatively coupled with an output terminal J3, at which an output signal (e.g., a high-power output signal) of architecture 100 may be provided, in accordance with some embodiments. The output signal available at output terminal J3 may differ in power as compared to the signal available at terminal J4; for instance, the output signal at output terminal J3 may be greater in power level than the output signal at terminal J4, in accordance with some embodiments. In accordance with some embodiments, the output signal at output terminal J3 may be of a different power level (e.g., a higher power level) than the output signal at output terminal J4.

In accordance with some embodiments, any (or all) of pre-driver 120, pre-driver 124, driver 126, pre-driver 128, and HPA 130 may be configured, for example, as a monolithic microwave integrated circuit (MMIC). In accordance with some embodiments, any (or all) of pre-driver 120, pre-driver 124, driver 126, pre-driver 128, and HPA 130 may include one or more gallium nitride (GaN)-based or other III-V semiconductor-based transistor devices. In some cases, such transistor devices may be configured as gallium nitride-on-silicon carbide (GaN-on-SiC) devices, though the present disclosure is not intended to be so limited, as other suitable Group IV semiconductor substrates may be employed, in accordance with other embodiments. Other suitable configurations for the various components of architecture 100 will depend on a given application and will be apparent in light of this disclosure.

As will be appreciated in light of this disclosure, the Gate Control signal(s) discussed above may be used in shutting off a given portion of either (or both) of channel chipsets 101a and 101b (e.g., any one or more of the various semiconductor dies of architecture 100). With such control over which of the individual semiconductor dies are in an on-state and which are in an off-state, tunable control over the gain and power levels of the output signal(s) of architecture 100 may be provided, in some cases realizing improvements in overall power and thermal management.

Figure 4:
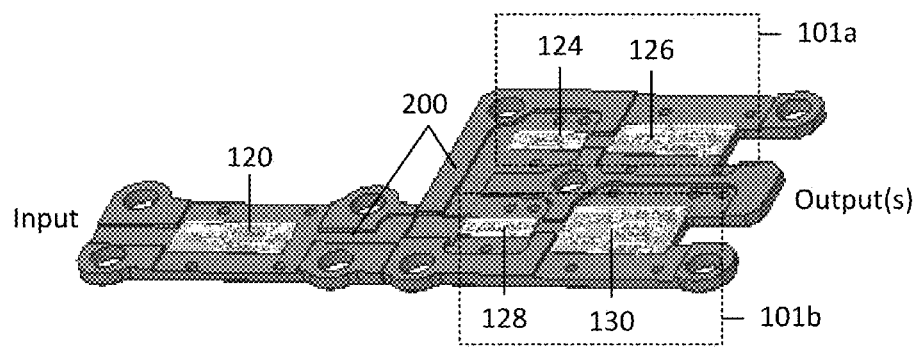
FIG. 4 illustrates a perspective view of several semiconductor dies disposed over a carrier configured in accordance with an embodiment of the present disclosure.

In order to provide thermal management for architecture 100, in part or in whole, any (or all) of pre-driver 120, pre-driver 124, driver 126, pre-driver 128, and HPA 130 may be physically and/or thermally coupled with a thermally conductive carrier 200. For instance, consider FIG. 4, which illustrates a perspective view of several semiconductor dies disposed over a carrier 200 configured in accordance with an embodiment of the present disclosure. Carrier 200 generally may serve as a heat spreader for at least a portion of architecture 100. To that end, carrier 200 may be formed, in part or in whole, from any one, or combination, of thermally conductive materials that are coefficient of thermal expansion (CTE)-compatible with one or more of the various semiconductor dies of architecture 100. In an example embodiment, carrier 200 may include, in part or in whole, of a copper-molybdenum (Cu—Mo) alloy. The dimensions (e.g., z-thickness in the z-direction) of carrier 200 may be customized, as desired for a given target application or end-use. In some cases, carrier 200 may have a z-thickness in the range of about 0.1-5 mm (e.g., about 0.1-2.5 mm, about 2.5-5 mm, or any other sub-range in the range of about 0.1-5 mm).

In some embodiments, carrier 200 may be a monolithic component. As will be appreciated in light of this disclosure, a monolithic carrier 200 may provide a continuous ground plane, which, at least in some cases, may help to realize a reduction in ground discontinuities between amplifier components which otherwise might cause gain dropouts. In other embodiments, however, carrier 200 may be a plurality of elements that are affixed, adjoined, or otherwise disposed proximate one another, providing a multi-piece component. For instance, in an example case, carrier 200 may include: (1) a first portion configured to host pre-driver 120; and (2) a second portion (e.g., a mezzanine portion) configured to host pre-driver 124, driver 126, pre-driver 128, and HPA 130. Thus, the second portion of such a carrier 200 may be considered, in a general sense, a super-carrier for semiconductor dies of architecture 100, configured, in accordance with some embodiments, to minimize (or otherwise reduce) ground plane discontinuities and associated gain reductions for operation at millimeter-wave frequencies. Other suitable materials, configurations, and dimensions for carrier 200 will depend on a given application and will be apparent in light of this disclosure.

Physical and/or thermal coupling of the various semiconductor dies (e.g., pre-driver 120, pre-driver 124, driver 126, pre-driver 128, and HPA 130) of architecture 100 with carrier 200 may be provided via any of a wide range of suitable means. Moreover, any of the various semiconductor dies of architecture 100 may be coupled with carrier 200 either directly or indirectly (e.g., with one or more intervening layers).

In accordance with some embodiments, a given semiconductor die of architecture 100 may be coupled with carrier 200 via a eutectic bonding process (e.g., eutectic soldering). More particularly, all (or some sub-set) of pre-driver 120, pre-driver 124, driver 126, pre-driver 128, and HPA 130 may be coupled with carrier 200 via eutectic bonding, in accordance with some embodiments. In a specific example case, pre-driver 120 may be coupled with a first portion of carrier 200, whereas each of pre-driver 124, driver 126, pre-driver 128, and HPA 130 may be coupled with a second portion (e.g., a mezzanine portion) of carrier 200. In some instances, pre-driver 124, driver 126, pre-driver 128, and HPA 130 may be so coupled with carrier 200 simultaneously (e.g., using a single eutectic bonding process to bond such semiconductor devices concurrently). In providing simultaneous attachment of such dies to carrier 200, mechanical and/or thermal interface attachment of carrier 200 with, for instance, a housing (e.g., such as housing 302, discussed below) may be provided in a CTE-compliant manner, in accordance with some embodiments.

Figure 5:
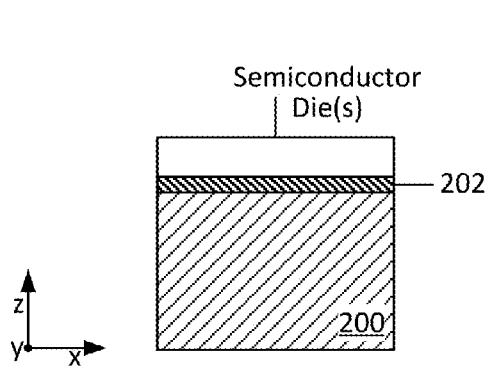
FIG. 5 illustrates a cross-sectional view of a semiconductor die coupled with a carrier via an intervening eutectic bonding layer, in accordance with an embodiment of the present disclosure.

FIG. 5 illustrates a cross-sectional view of a semiconductor die coupled with carrier 200 via an intervening eutectic bonding layer 202, in accordance with an embodiment of the present disclosure. As can be seen here, a eutectic bonding layer 202 may be disposed over a topography provided, in part or in whole, by carrier 200. Eutectic bonding layer 202 may include of one or more eutectic alloys, such as, for example, a gold-tin (Au—Sn) alloy. In a specific example case, a Au—Sn alloy having a compositional ratio of 80 wt-% Au and 20 wt-% Sn may be utilized, providing for a eutectic temperature of about 280° C. (±5° C.).

Eutectic bonding layer 202 may be disposed over a given underlying topography via any suitable standard, custom, or proprietary techniques, as will be apparent in light of this disclosure. In accordance with some embodiments, eutectic bonding layer 202 may be formed via any one, or combination, of a solder pre-form process, a physical vapor deposition (PVD) process, such as sputtering or dual-source evaporation, or an electroplating process, among others. Moreover, the dimensions (e.g., z-thickness in the z-direction) of a given eutectic bonding layer 202 may be customized, as desired for a given target application or end-use. In some cases, a given eutectic bonding layer 202 may have a thickness in the range of about 0.01-0.05 mm (e.g., about 0.01-0.03 mm, about 0.03-0.05 mm, or any other sub-range in the range of about 0.01-0.05 mm). Other suitable materials, formation techniques, and dimensions for a given eutectic bonding layer 202 will depend on a given application and will be apparent in light of this disclosure.

With a given eutectic bonding layer 202 in place, a given semiconductor die of architecture 100 may be disposed there over and coupled with carrier 200 via any suitable bonding process (e.g., heating, applying pressure, cooling, and so forth), in accordance with some embodiments. As will be appreciated in light of this disclosure, eutectic bonding of a given semiconductor die with underlying carrier 200 may result, at least in some instances, in a mechanically compliant interface and electrical interconnection there between in a single process.

Figure 6:
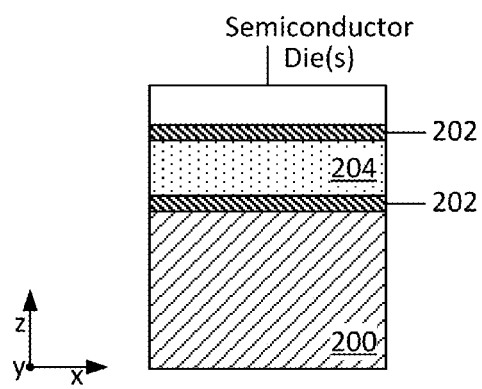
FIG. 6 illustrates a cross-sectional view of a semiconductor die disposed over a carrier and an intervening diamond layer, in accordance with an embodiment of the present disclosure.

As noted above, one or more intervening layers optionally may be disposed between a given semiconductor die of architecture 100 and underlying carrier 200. For instance, consider FIG. 6, which illustrates a cross-sectional view of a semiconductor die disposed over carrier 200 and an intervening diamond layer 204, in accordance with an embodiment of the present disclosure. As can be seen here, a diamond layer 204 may be coupled with carrier 200 via a eutectic bonding layer 202 (discussed above). In turn, a semiconductor die may be coupled with diamond layer 204 via another eutectic bonding layer 202. In accordance with some embodiments, all (or some sub-set) of pre-driver 120, pre-driver 124, driver 126, pre-driver 128, and HPA 130 may have an intervening diamond layer 204 disposed between it and underlying carrier 200. In a specific example embodiment, HPA 130 alone may have an intervening diamond layer 204 disposed between it and underlying carrier 200.

Diamond layer 204 may include a diamond material, which may be synthetic (e.g., formed via a chemical vapor deposition, or CVD, process) or naturally occurring (or both). In accordance with some embodiments, diamond layer 204 may be configured as any one, or combination, of the various diamond layers described in U.S. Pat. No. 8,669,812, issued on Mar. 11, 2014, and titled "High Power Amplifier," which is incorporated by reference herein in its entirety. In some cases, one or more metallic coatings optionally may be disposed over a topography provided, in part or in whole, by diamond layer 204. The dimensions (e.g., z-thickness in the z-direction) of diamond layer 204 may be customized, as desired for a given target application or end-use. In some cases, diamond layer 204 may have a z-thickness in the range of about 0.1-0.5 mm (e.g., about 0.1-0.3 mm, about 0.3-0.5 mm, or any other sub-range in the range of about 0.1-0.5 mm). Other suitable materials, coupling techniques, and dimensions for optional diamond layer(s) 204 will depend on a given application and will be apparent in light of this disclosure.

With a first eutectic bonding layer 202 in place, diamond layer 204 may be disposed there over and coupled with carrier 200 via any suitable bonding process (e.g., heating, applying pressure, cooling, and so forth), in accordance with some embodiments. With diamond layer 204 in place, a given semiconductor die of architecture 100 may be disposed there over and coupled with that diamond layer 204 via any suitable bonding process (e.g., heating, applying pressure, cooling, and so forth), in accordance with some embodiments. As will be appreciated in light of this disclosure, diamond material is a very good thermal conductor, and thus the presence of an optional diamond layer 204 between a given semiconductor die and underlying carrier 200 may facilitate conduction of heat generated by that die to carrier 200, in accordance with some embodiments. In a general sense, optional diamond layer 204 may be configured to serve, at least in part, as a heat spreader for a given semiconductor die coupled therewith.

Figure 7:
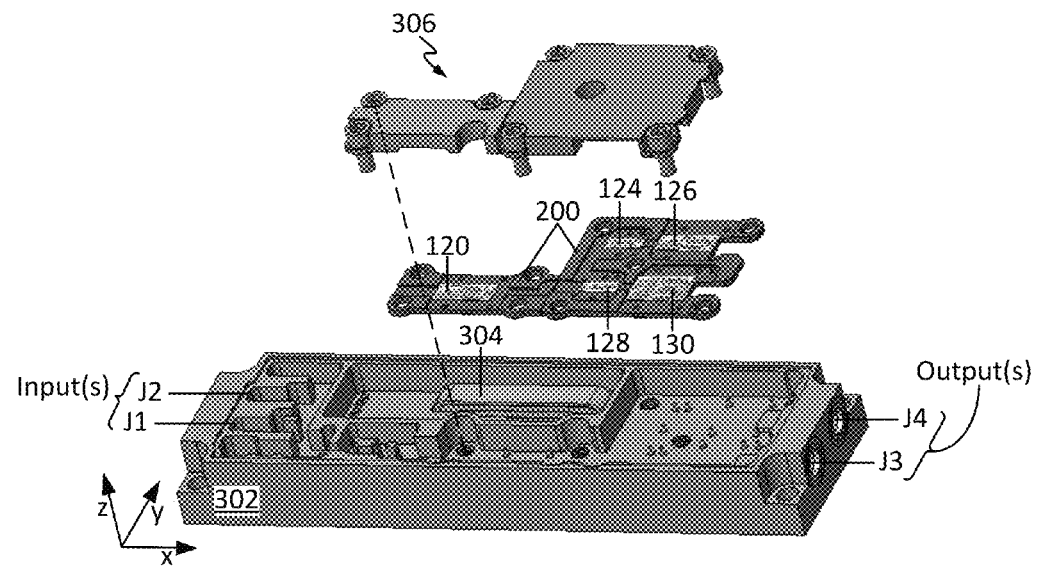
FIGS. 7-8 illustrate exploded perspective and plan views, respectively, of a partially assembled amplifier module configured in accordance with an embodiment of the present disclosure.
Figure 8:
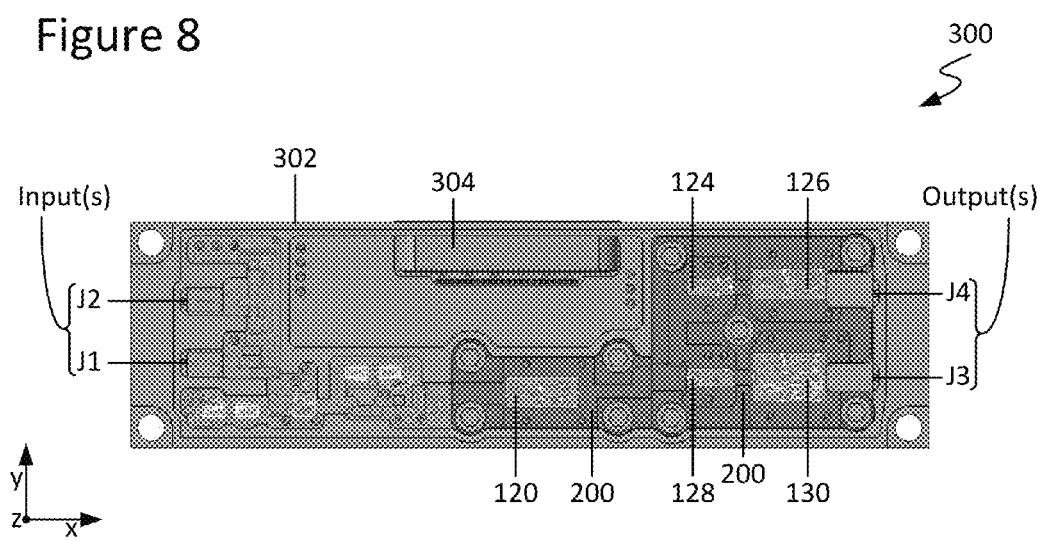
Figure 9:
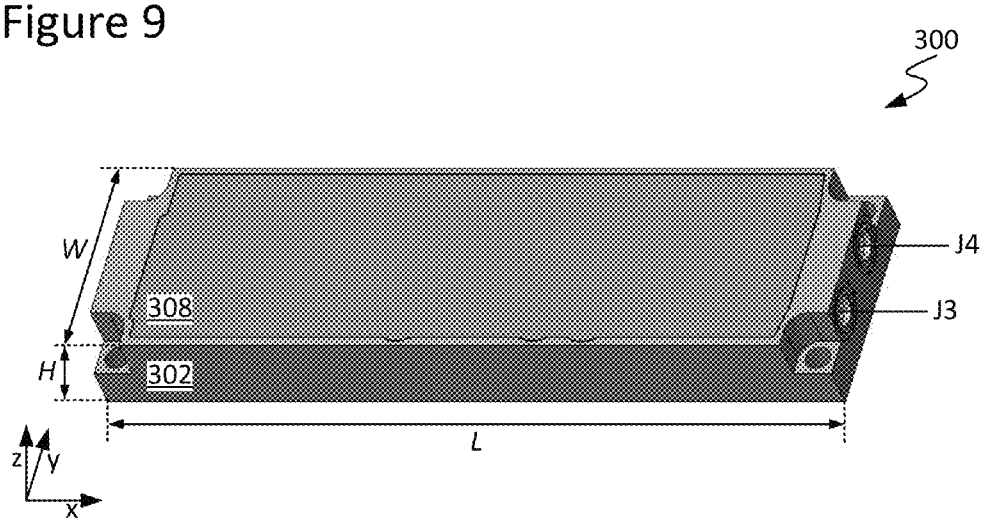
FIGS. 9-10 illustrate front and rear perspective views, respectively, of an amplifier module configured in accordance with an embodiment of the present disclosure.
Figure 10:
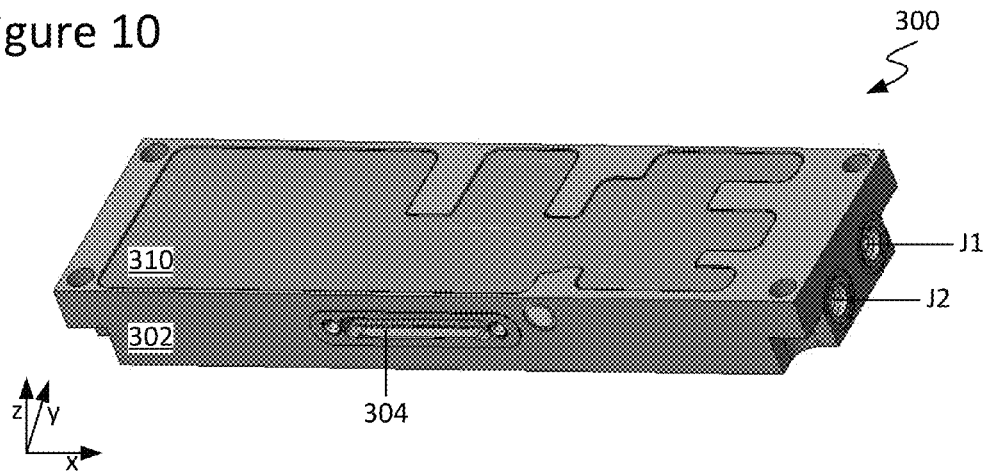

FIGS. 7-8 illustrate exploded perspective and plan views, respectively, of a partially assembled amplifier module 300 configured in accordance with an embodiment of the present disclosure. FIGS. 9-10 illustrate front and rear perspective views, respectively, of an amplifier module 300 configured in accordance with an embodiment of the present disclosure.

As can be seen from these figures, module 300 may include a housing 302. Housing 302 may include any one, or combination, of suitable construction material(s), such as aluminum (Al), titanium (Ti), a steel (e.g., carbon steel; stainless steel), or an alloy of any thereof, to name a few. Moreover, the dimensions (e.g., x-length in the x-direction; y-width in the y-direction; z-height in the z-direction) of housing 302 may be customized, as desired for a given target application or end-use.

In some cases, housing 302 may have an x-length in the range of about 3-5 inches (e.g., about 3-4 inches, about 4-5 inches, or any other sub-range in the range of about 3-5 inches). In an example case, housing 302 may have an x-length of about 4.4 inches (±0.5 inches). In another example case, housing 302 may have an x-length of about 3.54 inches (±0.5 inches).

In some cases, housing 302 may have a y-width in the range of about 0.5-3 inches (e.g., about 0.5-1.75 inches, about 1.75-3 inches, or any other sub-range in the range of about 0.5-3 inches). In an example case, housing 302 may have a y-width of about 2.2 inches (±0.5 inches). In another example case, housing 302 may have a y-width of about 1.00 inches (±0.5 inches).

In some cases, housing 302 may have a z-height in the range of about 0.2-2 inches (e.g., about 0.2-1.1 inches, about 1.1-2 inches, or any other sub-range in the range of about 0.2-2 inches). In an example case, housing 302 may have a z-height of about 0.40 inches (±0.2 inches).

As can be seen, housing 302 may be configured to host carrier 200 and the one or more semiconductor dies of architecture 100 coupled therewith, in accordance with some embodiments. Carrier 200 optionally may be physically and/or thermally coupled with housing 302 via one or more intervening thermal interface layers, in accordance with some embodiments. In some cases, a given thermal interface layer may be a layer of a thermally conductive epoxy or any other suitable standard, custom, or proprietary thermally conductive adhesive, as will be apparent in light of this disclosure. In some cases, a given thermal interface layer may be a thermal pad including silicone or carbon graphite, among others. In accordance with some embodiments, means for mechanical attachment, such as fasteners and the like, may be employed additionally (or alternatively), and in some such instances may facilitate CTE-compliance.

As can be seen further, housing 302 may include one or more electrical connection ports 304 configured to be operative coupled with architecture 100 when installed within housing 302, in accordance with some embodiments. In some cases, a given port 304 may be operatively coupled with either (or both) of amplifiers 108 and 114, for instance, to allow for $V_{Out}$ signal(s) to be output from architecture 100 to an EW system external to architecture 100.

Module 300 further may include one or more cover portions 306 configured to be disposed over carrier 200 and its attendant semiconductor die(s), in accordance with some embodiments. In some embodiments, a given cover portion 306 may be a monolithic component and configured to provide coverage for a similarly monolithic carrier 200, as discussed above. In other embodiments, a given cover portion 306 may be a plurality of elements that are affixed, adjoined, or otherwise disposed proximate one another, providing a multi-piece component and configured to provide coverage for a similarly multi-piece carrier 200, as discussed above. In accordance with some embodiments, a given cover portion 306 may be considered, in a general sense, a channelization cover for architecture 100.

As can be seen further from these figures, module 300 may include either (or both) a front housing cover 308 and a rear housing cover 310. A given housing cover 308 or 310 may be constructed with any of the example materials discussed above, for instance, with respect to housing 302, in accordance with some embodiments.

In accordance with some embodiments, architecture 100 optionally may be configured to be operatively coupled with one or more external circuits or devices. For instance, in some embodiments, architecture 100 may be operatively coupled with DC power conditioning circuitry and/or DC routing circuitry, which may be configured as one or more topside and/or backside DC printed wire boards (PWBs). In some cases, the use of such PWB(s) may provide for routing DC bias signals and control signals through module 300 using minimal (or otherwise reduced) area. In some embodiments, architecture 100 may be configured to be operatively coupled with one or more sensors (e.g., of an EW system). In some cases when optionally included, such additional circuits and devices may be housed, in part or in whole, by module 300, and housing 302 may be appropriately configured to that end, in accordance with some embodiments.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. A solid-state amplifier comprising:
a first input configured to receive a first radio frequency (RF) signal from a first source external to the amplifier;
a second input configured to receive a second RF signal from a second source external to the amplifier;
a first chipset configured to amplify a first sub-band of the second RF signal;
a second chipset configured to amplify a second sub-band of the second RF signal; and
a carrier coupled with at least one of the first chipset and the second chipset, wherein the carrier comprises a thermally conductive material and further comprising a diamond layer between the carrier and at least one semiconductor die of at least one of the first chipset and the second chipset, wherein:
the carrier is coupled to the diamond layer via a first eutectic bonding layer; and
the at least one semiconductor die is coupled to the diamond layer via a second eutectic bonding layer.

2. The solid-state amplifier of claim 1 further comprising at least one successive detection logarithmic video amplifier (SDLVA) configured to receive the first RF signal and output a signal indicative of an amplitude level of the first RF signal received by the first input.

3. The solid-state amplifier of claim 2, wherein the second input further comprises at least one successive detection logarithmic video amplifier (SDLVA) and is configured to receive the second RF signal from the second source external to the amplifier, wherein the second RF signal is in response to receipt of the signal indicative of the amplitude level of the first RF signal.

4. The solid-state amplifier of claim 1, wherein the carrier constitutes a monolithic component.

5. The solid-state amplifier of claim 1, wherein the carrier constitutes a multi-piece component comprising at least:
a first portion; and
a second portion to which both the first chipset and the second chipset are coupled.

6. The solid-state amplifier of claim 1, wherein the carrier comprises a copper-molybdenum (Cu—Mo) alloy.

7. The solid-state amplifier of claim 1, wherein the carrier is coupled with the at least one of the first chipset and the second chipset via at least one eutectic bonding layer.

8. The solid-state amplifier of claim 1, wherein:
the first chipset comprises:
a pre-driver; and
a driver operatively coupled with an output of the pre-driver; and
at least one of the pre-driver and the driver is configured as a gallium nitride (GaN)-based monolithic microwave integrated circuit (MMIC).

9. The solid-state amplifier of claim 1, wherein:
the second chipset comprises:
a pre-driver; and
a high power amplifier operatively coupled with an output of the pre-driver; and
at least one of the pre-driver and the high power amplifier is configured as a gallium nitride (GaN)-based monolithic microwave integrated circuit (MMIC).

10. The solid-state amplifier of claim 1 further comprising a divider configured to split the second RF signal for delivery to the first chipset and the second chipset.

11. The solid-state amplifier of claim 10 further comprising a pre-driver configured to deliver the second RF signal to the divider.

12. The solid-state amplifier of claim 1, wherein at least one of the first source and the second source comprises an electronic warfare (EW) system.

13. The solid-state amplifier of claim 1, wherein the at least one semiconductor die is coupled simultaneously to an interface attachment of the carrier.

14. A power amplifier device comprising:
a first chipset configured to amplify a first sub-band of a radio frequency (RF) input signal, the first chipset comprising:
a first pre-driver; and
a first driver operatively coupled with an output of the first pre-driver;
a second chipset configured to amplify a second sub-band of the RF input signal, the second chipset comprising:
a second pre-driver; and
a high power amplifier operatively coupled with an output of the second driver; and
a carrier, wherein at least one of the first pre-driver, the first driver, the second pre-driver, and the high power amplifier is coupled with the carrier via at least one eutectic bonding layer;
further comprising a diamond layer disposed between the carrier and at least one of the first pre-driver, the first driver, the second pre-driver, and the high power amplifier, wherein:
the diamond layer is coupled with the carrier via a first eutectic bonding layer of the at least one eutectic bonding layer; and
the at least one of the first pre-driver, the first driver, the second pre-driver, and the high power amplifier is coupled with the diamond layer via a second eutectic bonding layer of the at least one eutectic bonding layer.

15. The power amplifier device of claim 14, wherein the carrier comprises a copper-molybdenum (Cu—Mo) alloy and is configured as a monolithic component.

16. The power amplifier device of claim 14, wherein the carrier at least partially comprises a copper-molybdenum (Cu—Mo) alloy and is configured as a multi-piece component comprising at least:
a first portion; and
a second portion to which the first pre-driver, the first driver, the second pre-driver, and the high power amplifier are coupled.

17. The power-amplifier device of claim 14, wherein the first pre-driver, the first driver, and the second pre-driver are coupled simultaneously to an interface attachment of the carrier.

18. A radio frequency (RF) transmitter comprising:
a power amplifier architecture configured to receive a radio frequency (RF) input signal and comprising:
a first chipset configured to amplify at least one of a first sub-range and a full range of a K-band through $K_a$-band instantaneous frequency range of the RF input signal, wherein the resultant amplified signal is of a first power level; and
a second chipset configured to amplify at least one of a second sub-range and the full range of the K-band through $K_a$-band instantaneous frequency range of the RF input signal, wherein the resultant amplified signal is of a second power level that differs from the first power level;
a thermally conductive carrier to which the first chipset and the second chipset are coupled; and a housing configured to house the power amplifier architecture and the thermally conductive carrier, wherein the thermally conductive carrier is configured to be physically coupled with the housing;

further comprising a diamond heat spreader disposed between at least a portion of the second chipset and the thermally conductive carrier, wherein the diamond heat spreader is coupled with the thermally conductive carrier via a first eutectic bonding layer, and the at least a portion of the second chipset is coupled with the diamond heat spreader via a second eutectic bonding layer.

19. The RF transmitter of claim 18, wherein at least one of the first chipset and the second chipset is coupled with the thermally conductive carrier via at least one eutectic bonding layer.

* * * * *